(12) United States Patent
Wang et al.

(10) Patent No.: US 7,609,131 B2
(45) Date of Patent: Oct. 27, 2009

(54) COUPLING FILTER DEVICE WITH SPECIFIC COUPLING COEFFICIENT

(75) Inventors: Kuo-Hsiung Wang, Taipei Hsien (TW); Wei-Ching Shih, Taipei Hsien (TW)

(73) Assignee: Prosperity Dielectrics Co., Ltd. (TW)

( * ) Notice: Subject to any disclaimer, the term of this patent is extended or adjusted under 35 U.S.C. 154(b) by 0 days.

(21) Appl. No.: 11/895,257

(22) Filed: Aug. 23, 2007

(65) Prior Publication Data
US 2008/0048801 A1 Feb. 28, 2008

(30) Foreign Application Priority Data
Aug. 23, 2006 (TW) .............................. 95214948 U (51) Int. Cl.
*H03H 7/01* (2006.01)
(52) U.S. Cl. .................... 333/177; 333/175; 333/185
(58) Field of Classification Search ............... 333/167, 333/177, 185; 336/65, 90, 98; 361/821, 361/836; 174/50, 50.54; 334/71, 75, 76
See application file for complete search history.

(56) References Cited

U.S. PATENT DOCUMENTS

| | | | | |
|---|---|---|---|---|
| 3,706,949 A | * | 12/1972 | Kawakami et al. | 333/181 |
| 3,783,417 A | * | 1/1974 | Osada et al. | 333/185 |
| 4,325,040 A | * | 4/1982 | Whitley | 334/17 |
| 4,490,699 A | * | 12/1984 | Yanagida | 333/202 |
| 4,581,596 A | * | 4/1986 | Dirmeyer et al. | 333/181 |
| 4,980,663 A | * | 12/1990 | Moyer | 334/8 |
| 5,805,431 A | * | 9/1998 | Joshi et al. | 361/836 |
| 6,476,689 B1 | * | 11/2002 | Uchida et al. | 333/177 |

* cited by examiner

*Primary Examiner*—Robert Pascal
*Assistant Examiner*—Kimberly E Glenn
(74) *Attorney, Agent, or Firm*—Ladas & Parry LLP (57) ABSTRACT

The present invention provides a surface mount design (SMD) coupling filter device with a fixed coupling coefficient having a pair of hollow coils. Theoretically, coupling coefficients of two hollow coils may vary with the parameter such as distance, number of windings, inner radius, wire size, medium coefficient. When a desired coil coupling distance is derived from the above parameters, a pair of hollow coils then is fastened fixed by either a house fastening approach or an adhesive injection fastening approach, such that the desired coil coupling distance can be fixed by using an adhesive with a specific medium coefficient.

20 Claims, 11 Drawing Sheets

WITHOUT TILTING

FIG. 8a (Prior Art)

WITH TILTING

FIG. 8b (Prior Art)

$$M = \frac{LT_1 - LT_2}{4}$$

$$K = \frac{M}{\sqrt{L_1 \times L_2}}$$

$LT_1 \Rightarrow Lad$ (b, c Short)
$LT_2 \Rightarrow Lac$ (b, d Short)

| Derived Coupling Distance DKn | Coupling Series Kn |
|---|---|
| DK1 | K1 |
| DK2 | K2 |
| DK3 | K3 |
| DK4 | K4 |

COUPLING FILTER DEVICE WITH SPECIFIC COUPLING COEFFICIENT

FIELD OF THE INVENTION

The present invention is related to a filter structure device. Particularly, the present invention is related to a coupling filter device having a specific coupling coefficient.

BACKGROUND OF THE INVENTION

Electronic communication products have been broadly applied in various fields. Radio frequency (RF) electronic devices are designed to convert signals through the coupling of magnetic devices. Therefore, it is a need to install the coupling filter device onto circuit boards of communication products.

Figure 6A:
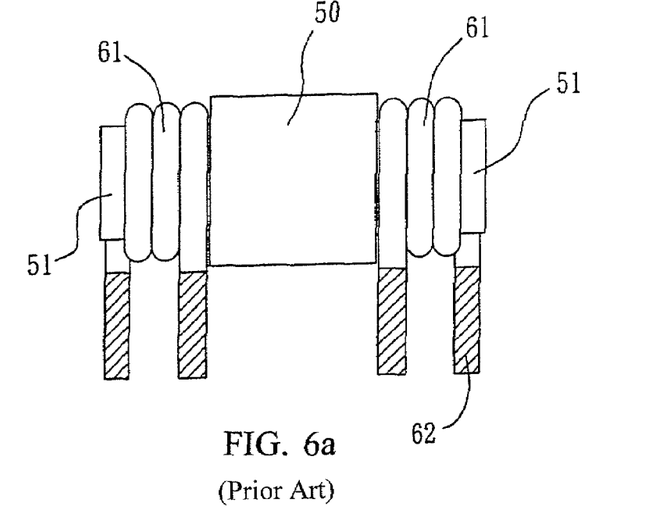
FIGS. 6a and 6b: A side view of front view of the conventional first type design of a coupling device.
Figure 6B:
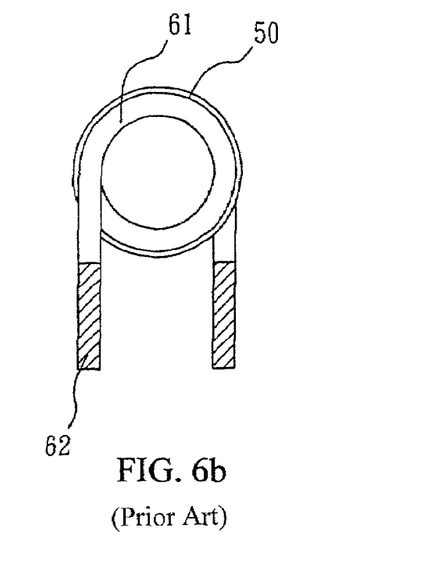

Today, the winding design can be categorized by two types:

First Type Design:

As illustrated in FIG. 6, the device comprises a rod (50) and two coils (61) while winding regions (61) are respectively disposed on two ends of the rod (50). Each coil (61) having two insert ends (62) forming at the ends winds on the winding regions (51) of the rod (50). Under the current practice, it is manually inserting and soldering the insert ends (62) of two coils (61) to a circuit board to assemble a coupling coil therewith.

Figure 7A:
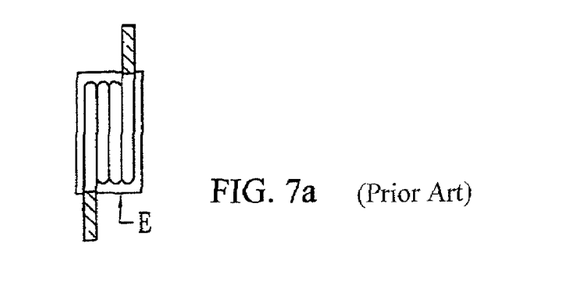
FIGS. 7a and 7b: A side view of front view of the conventional second type design of a coupling device.
Figure 7B:
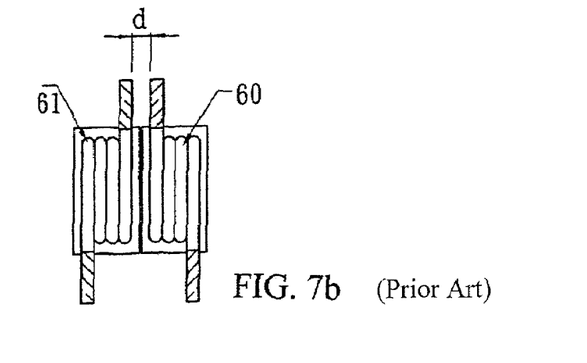

Second Type Design:

Referring to FIG. 7, it is similar to the invention that fixes a product by adhesive injection. However, currently all these types of coil products are with single coil and therefore cannot achieve the effect of coupling filtering. To apply the technique of coupling filtering, two elements are usually used to be placed on a circuit board and are manually spaced by a distance for designing a coupling filter circuitry in order to achieve the function of high frequency signal coupling filtering.

However, the structure design of the current coupling devices (as illustrated in FIG. 6 and FIG. 7) is made manually and usually takes much time with strenuous effort. Further, the product's size of the rough edges may directly affect tuning the coupling distance between two coils and electrical features are thus dissatisfactory. Meanwhile, manual fabrication may cause inconsistency of quality and stability such that the product's coupling function is affected too. These kinds of problems are uneconomical for manufacturers and upsetting users as well.

SUMMARY OF THE INVENTION

In view of the defects of the current techniques and structures, the present invention provides a coupling filter device having a specific coupling coefficient. Theoretically (see FIG. 9), a desired coupling distance of a pair of hollow coils can be obtained. In addition, the desired coupling distance of the pair of hollow coils can be fixed by either a house fastening approach or an adhesive injection fastening approach such that the desired coupling distance can be fixed using an adhesive having a specific medium coefficient. A coupling filter device with a specific coupling coefficient, comprising: a set of two hollow coils spaced by a distance d; a fastening mechanism for fastening said two hollow coils and a fixing adhesive (E) having a specific medium coefficient being filled therein, such that a coupling coefficient (DKn) existing between the hollow coils is substantially a constant; and a contact portion for contacting with solder pads on a circuit board.

DETAILED DESCRIPTION OF THE INVENTION

Figure 1:
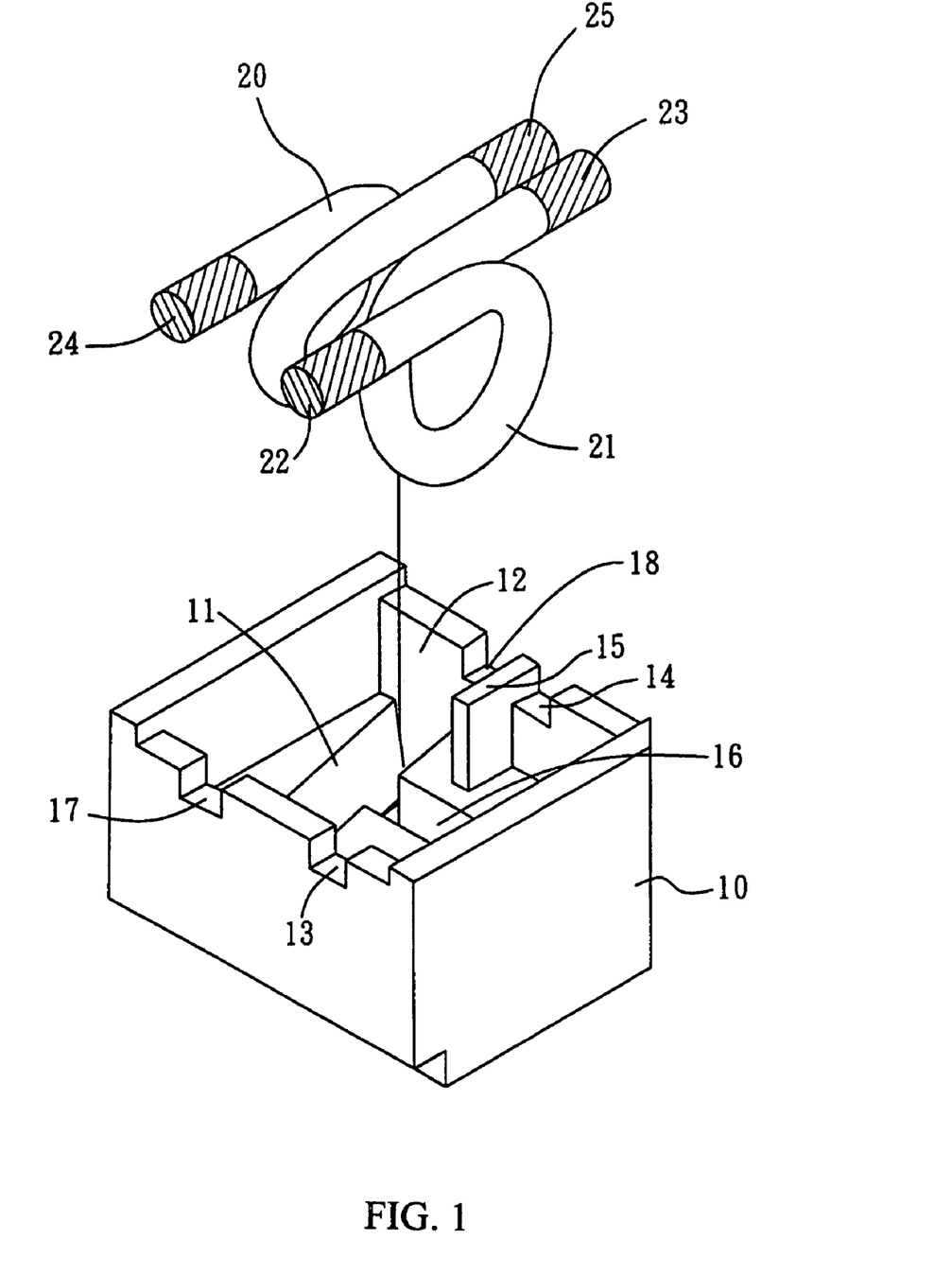
FIG. 1: A 3-D structure of the first embodiment of the present invention.
Figure 2A:
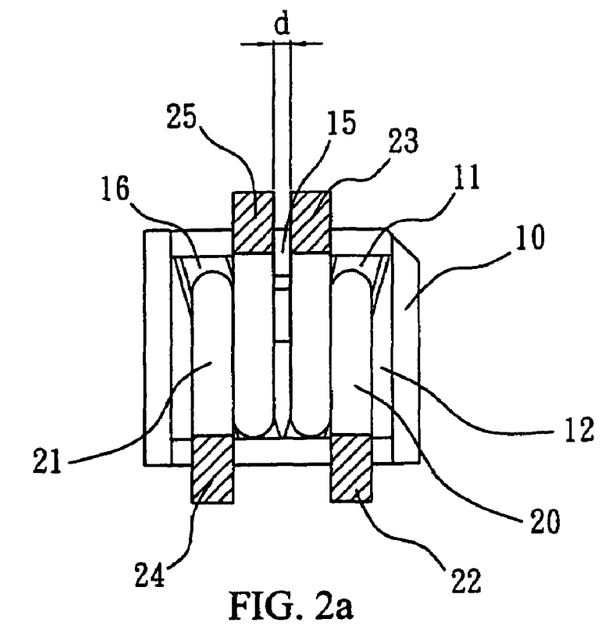
FIGS. 2a and 2b: A bottom view and a side view of the first embodiment of the present invention.
Figure 2B:
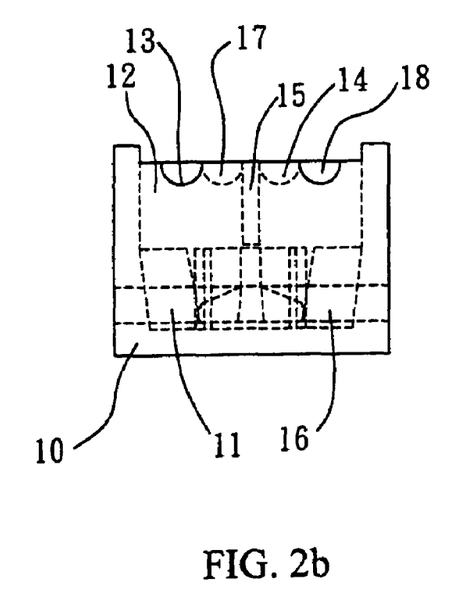

Products manufactured in accordance with the present invention are two types: surface mount design (SMD) and through-hole design. Both types of products comply with the standard of automatic processing procedure. To achieve the above-mentioned purpose, the present invention provides a house fastening approach or an adhesive injection fastening approach which are respectively explained as follows:

I. House Fastening Approach:

As illustrated in FIG. 1, a house (10) has trough lines (11, 16) for positioning a set of hollow coils (20, 21). Coil ends (24, 25) of coil (20) and coil ends (22, 23) of coil (21) respectively form insert ends (22, 23, 24, 25) inserting to insert opens (13, 14, 17, 18). Referring to FIG. 2, the device is capable of filtering and processing signals in the frequency range of high frequencies including very high frequency (VHF), ultra high frequency (UHF) and intermediate frequency (IF), by controlling distance (d) between two coils (20, 21) while selecting an adhesive having a specific medium coefficient to fix the device.

Figure 5A:
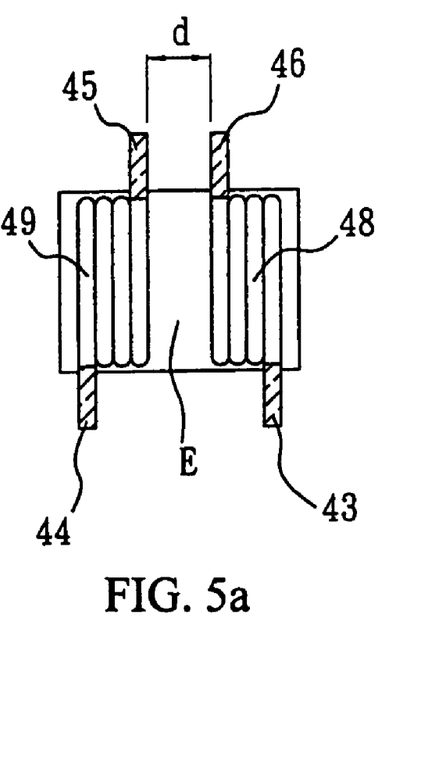
FIGS. 5a, 5b and 5c: A bottom view and a side view of the second embodiment of the present invention.
Figure 5B:
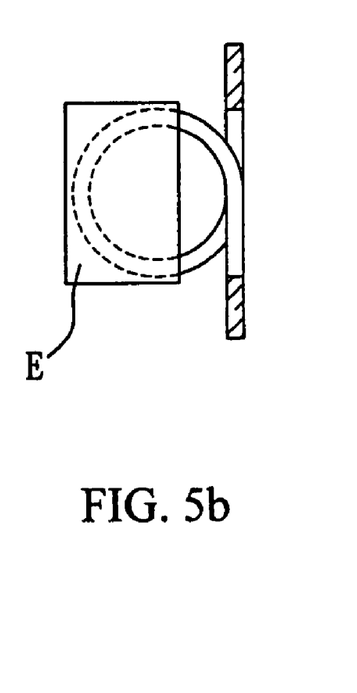
Figure 5C:
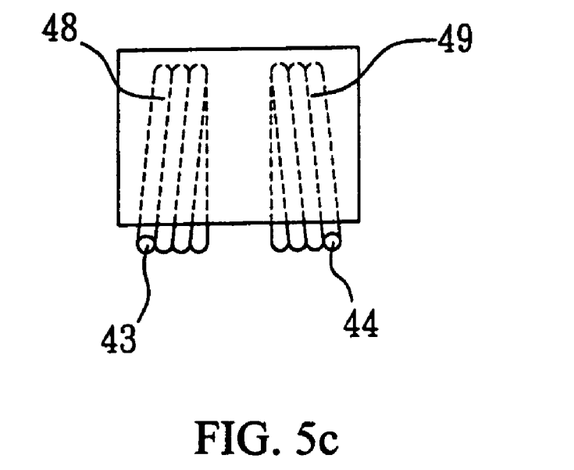

II. Adhesive Injection Fastening Approach:

As illustrated in FIG. 5, an adhesive (E) having a specific medium coefficient is selected and injected into a mold having coil positioning design. By placing coils (48, 49) into the mold and baking the same to cure the device, distance (d) between these two coils (48, 49) is maintained and the device is capable of filtering and processing signals in the frequency range of VHF, UHF and IF.

Figure 3A:
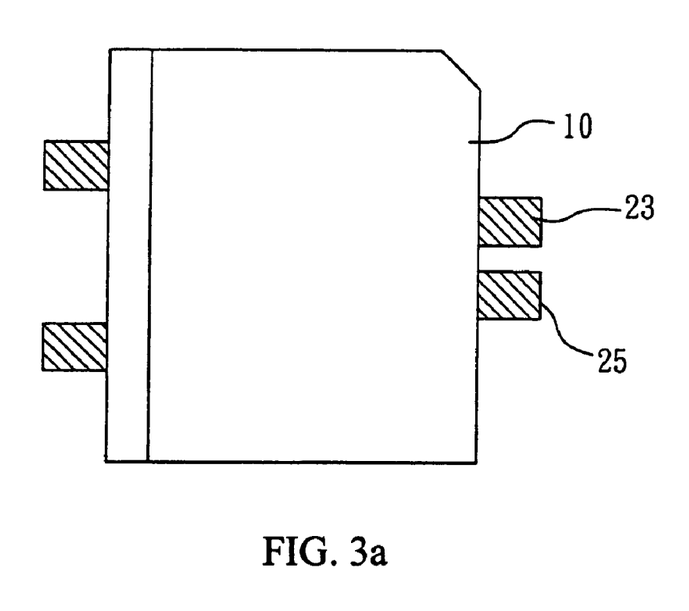
FIGS. 3a and 3b: Another angle of 3-D structure of the first embodiment of the present invention.
Figure 3B:
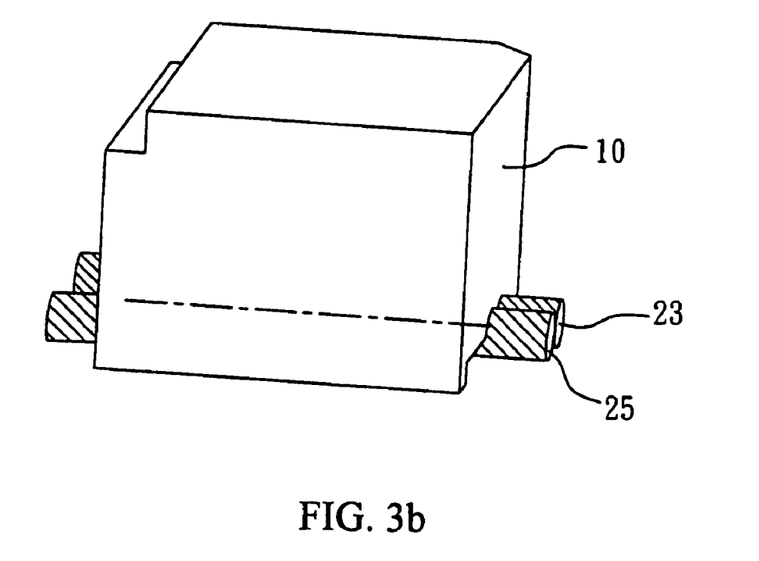

FIGS. 1, 2 and 3 show the first embodiment of a coupling filter device having a specific coupling coefficient of the present invention comprising a house (10) and at least two coils (20, 21).

House (10), referring to the illustration of FIG. 1 and FIG. 2, has two line troughs (11, 16) forming therein and connecting to each other. An open (12) is formed at one side of house (10) connecting to line trough (11). A plurality of insert opens (13, 14, 17, 18) are respectively formed on open (12) disposing on opposite sides. A divider (15) is disposed between two adjacent insert opens (14, 18) and between trough lines (11) protruding toward the trough lines for controlling the coupling distance of coils (20, 21). It is observed that the back of the house is flat and a chamfer is created outside of the house to auxiliary identify the device's orientation enabling the device being able to be, such as grabbed, sucked, positioned and installed onto a circuit board, manufactured by automatic processes.

In this embodiment, each coils (20, 21) is formed by bending a wire to form at least one winding and coils (20, 21) are disposed on two line troughs (11, 16). In addition, insert ends (22, 23, 24, 25) are respectively formed at the beginning and ending portions of the bending wire. The insert ends (22, 23, 24, 25) may insert into insert opens (13, 14, 17, 18) and protruding insert ends (24, 25, 22, 23) disposing on opposite sides of house (10). Each insert end (22, 23, 24, 25) may be preprocessed by varnish removal and anti-oxidation such that it can be easily soldered on a circuit board during a SMD soldering process in the following stage. In this embodiment, the number of winding is one.

Further, when coils (20, 21) and house (10) are integrated, an adhesive having a specific medium coefficient will be injected to house (10) through open (12) to fasten the coils (20, 21) to the inner portion of house (10).

When a coupling filter device having a specific coupling coefficient is integrated with a circuit board, a processing table may be used for disposing the coupling filter device onto the circuit board while insert ends (22, 23, 24, 25) protruding the opposite sides of the house (10) contact the surface of the circuit board. When soldering is performed to the circuit board having coupling devices thereon, insert ends (22, 23, 24, 25) are fastened on the circuit board with solder paste.

As stated above, the coupling filter device having a specific coupling coefficient may be manufactured by automatic equipment by grapping, sucking, positioning, and installing the coupling filter device to a circuit board such that certain manpower and labor can be saved. Besides, this provides convenience to manufacturers as well.

Figure 4:
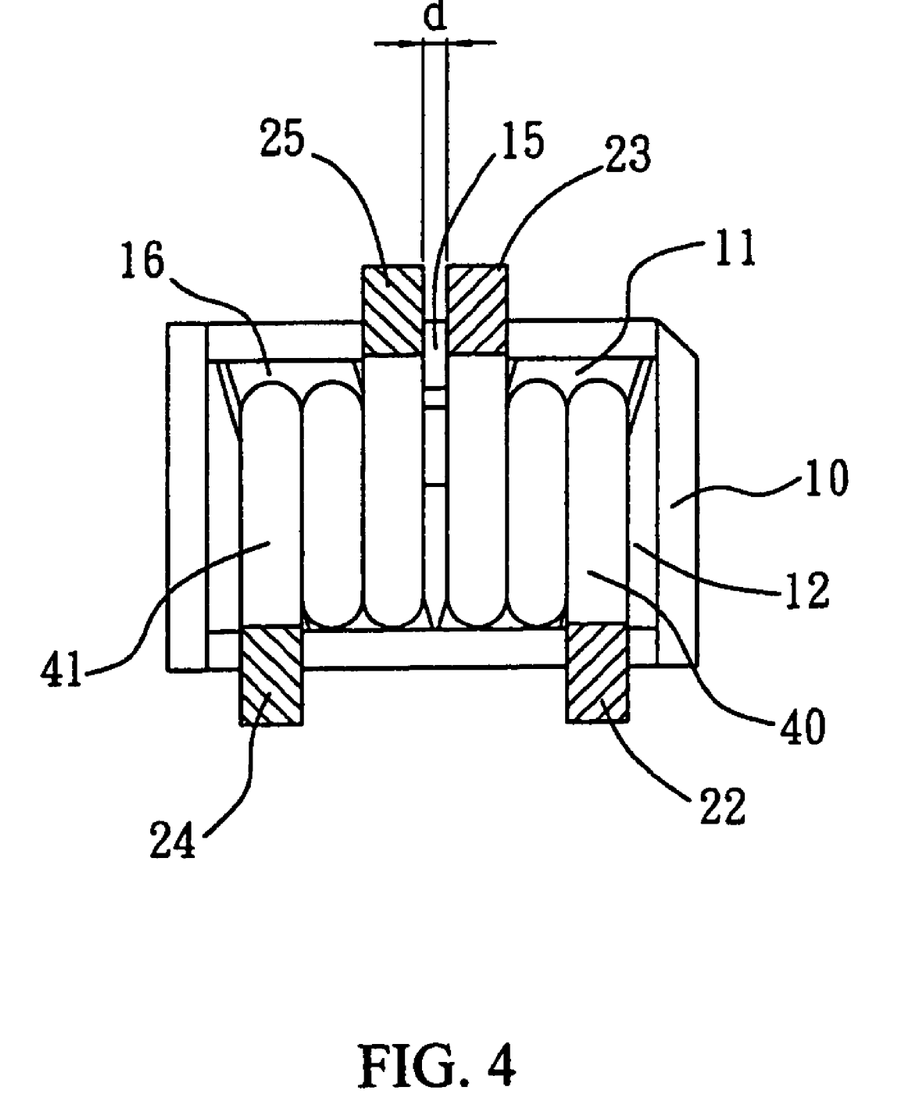
FIG. 4: A bottom view of the second embodiment (different number of windings) of the present invention.

FIGS. 4 and 5 show the second embodiment of a coupling filter device having a specific coupling coefficient of the present invention. In this embodiment, two coils (40, 41) disposing outside of house (10) are respectively bended as two winding coils.

Products manufactured in accordance to the present invention may be customized having coils with single or multiple windings.

Figure 8A:
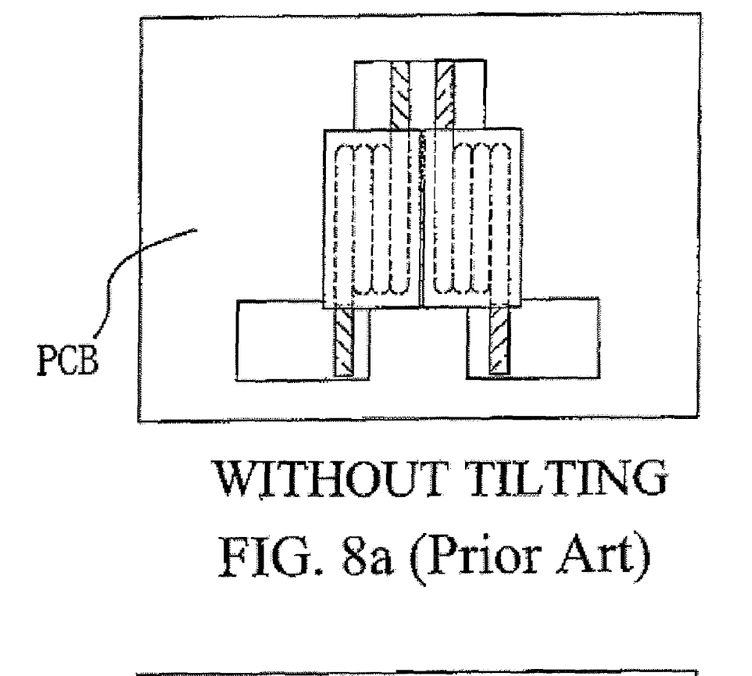
FIGS. 8a and 8b: An example of a tilting coupling device made by conventional techniques.
Figure 8B:
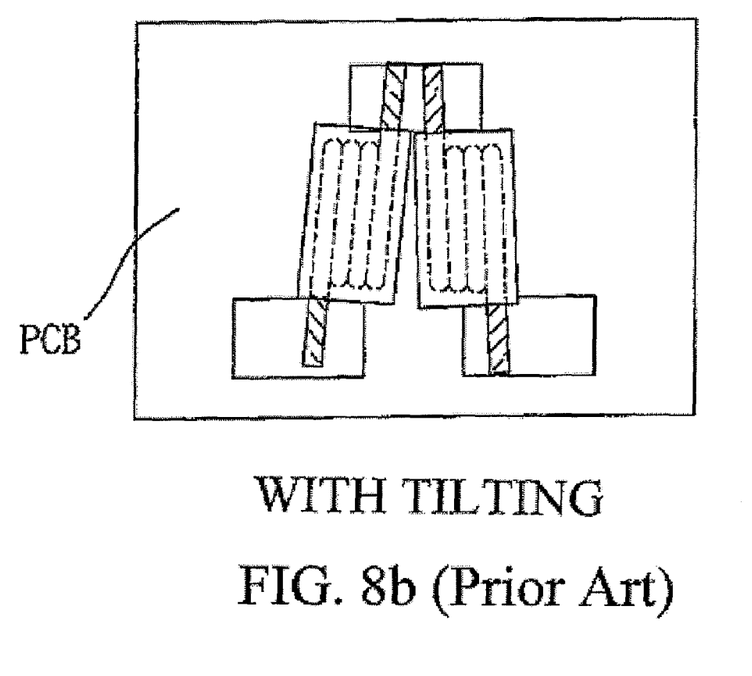
Figure 9:
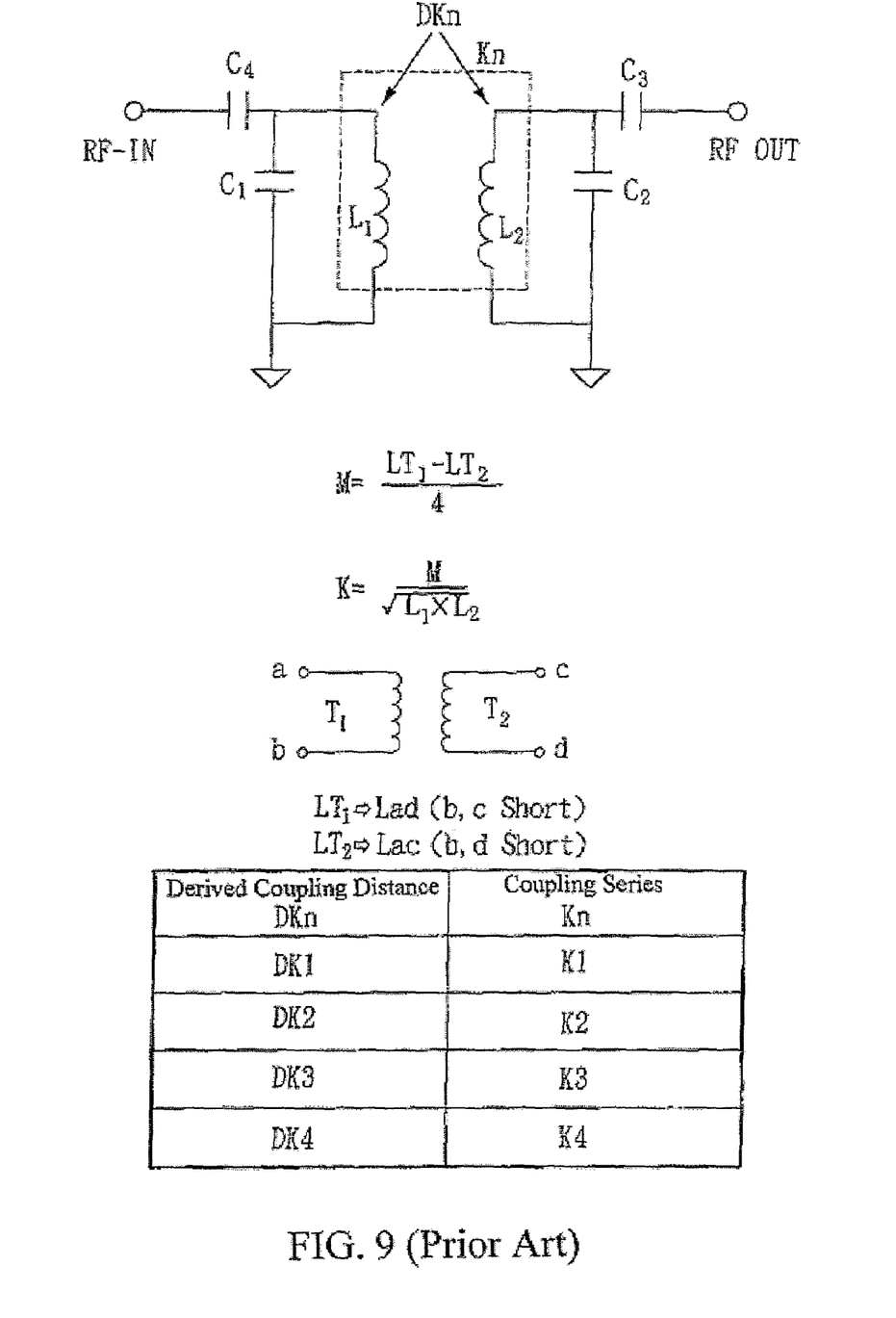
FIG. 9: A diagram of a hollow coils with coupling coefficients.
Figure 10:
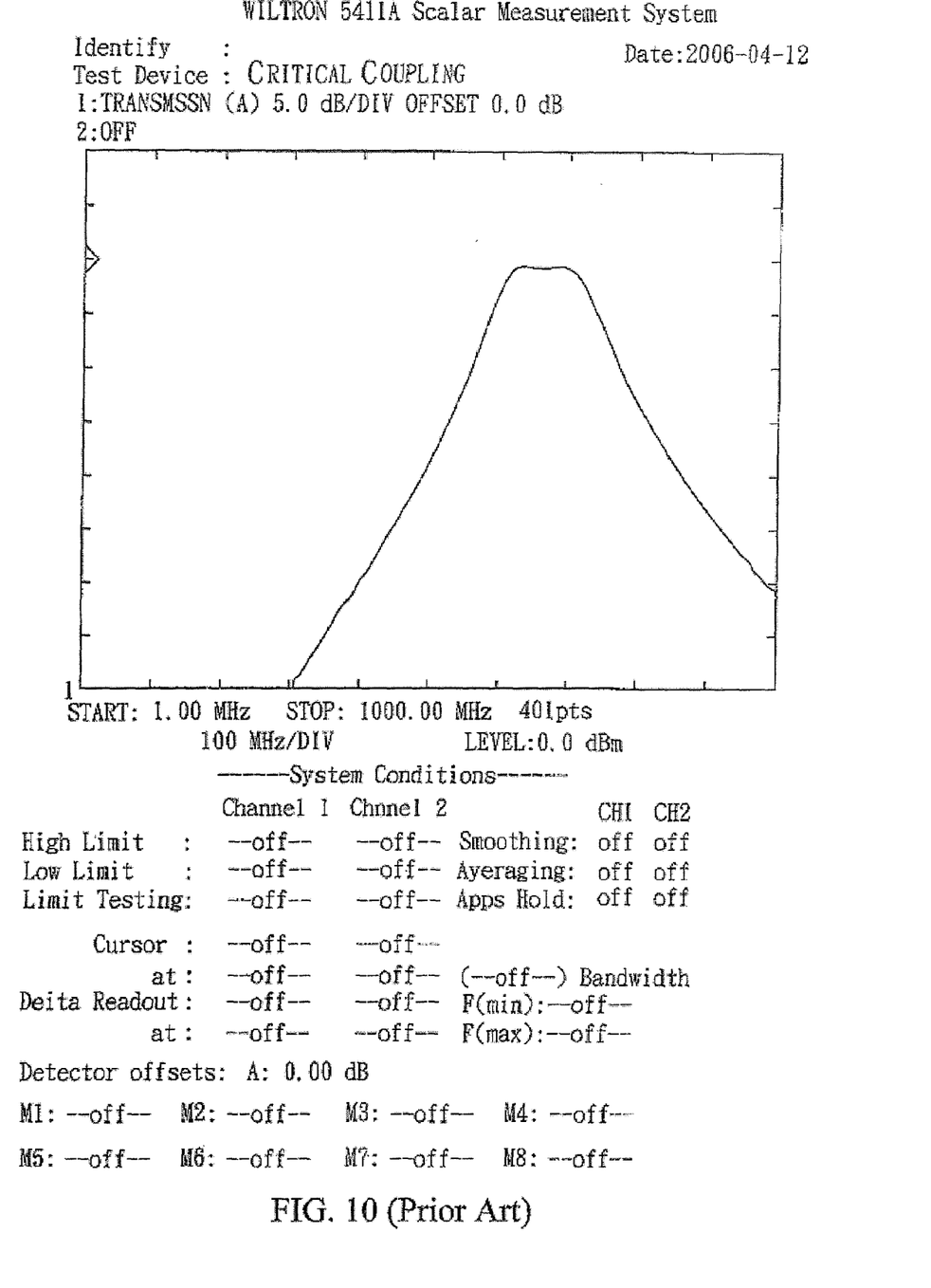
FIGS. 10-12: Curves of coupling coefficients.
Figure 11:
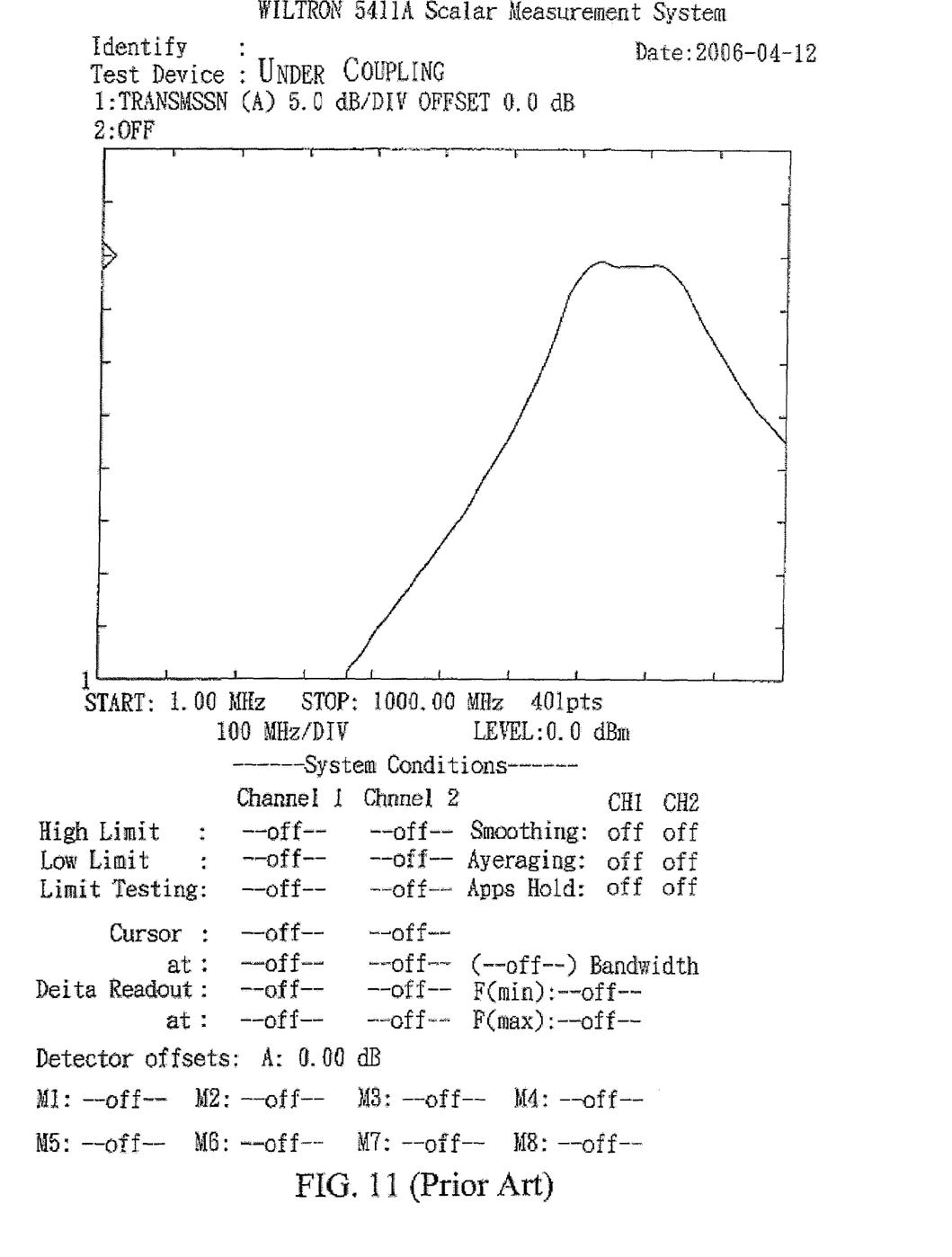
Figure 12:
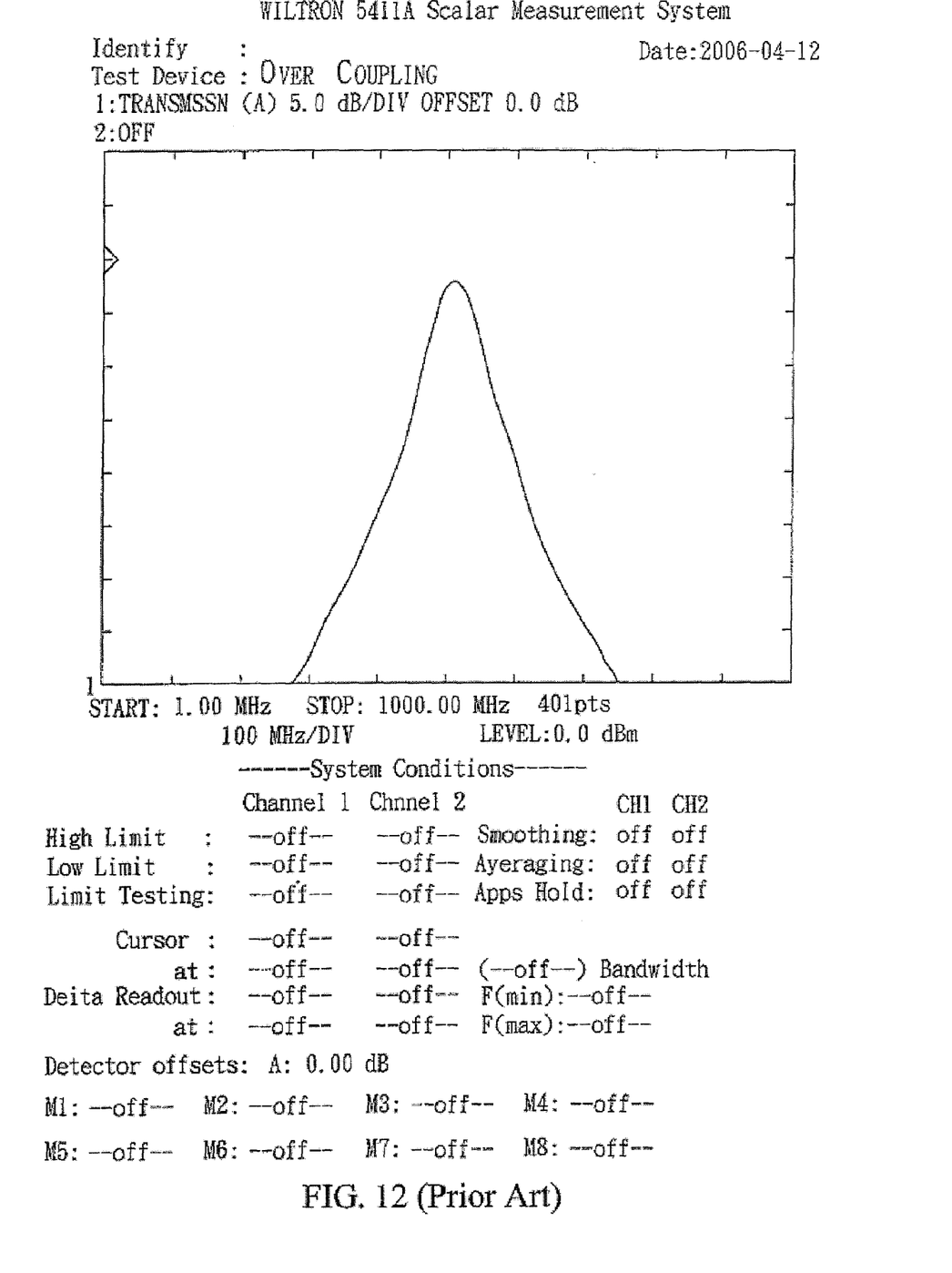

FIGS. 8a and 8b show an example of a tilting coupling device made by conventional techniques. FIG. 9 shows a diagram of hollow coils with coupling coefficients. FIGS. 10-12 show curves of coupling coefficients.

Although the present invention is described using the above embodiments, it does not mean that the scope of the present invention is limited to the above description. Therefore, persons skilled in the art can make all kinds of modifications, for example, changing the selected polymeric material, introducing different conductive particles, changing electroplating conditions, changing constituent weight ratio, to achieve the same effects. The protective scope of the present invention shall be limited to the description of the claims.

REFERENCE NUMERALS FOR THE MAJOR PARTS 10 house
11, 16 line trough
12 open
13, 14, 17, 18 insert open
15 divider
20, 21, 40, 41 coil
48, 49, 60, 61 coil
22, 23, 24, 25 insert end
43, 44, 45, 46 soldering end
50 rod
51 winding region
62 insert end
E adhesive

What is claimed is:

1. A coupling filter device with a specific coupling coefficient, comprising:
   a set of two hollow coils spaced by a distance d;
   a fastening mechanism for fastening said two hollow coils and a fixing adhesive (E) having a specific medium coefficient being filled therein, such that a coupling coefficient (DKn) existing between the hollow coils is substantially a constant; and
   a contact portion for contacting with solder pads on a circuit board.

2. The coupling filter device of claim 1, wherein said fastening mechanism is a house fastening structure.

3. The coupling filter device of claim 2, wherein said house fastening structure further comprises:
   a house having trough lines therein for positioning said set of hollow coils; and
   a plurality of insert opens with respect to said trough lines disposed on opposite sides of said house for fixing insert ends of said set hollow coils.

4. The coupling filter device of claim 3, further comprising a divider disposed between two adjacent insert opens of said plurality of insert opens of said house and between said trough lines and protruding toward said trough lines.

5. The coupling filter device of claim 4, wherein said insert opens protrude on two sides of said house.

6. The coupling filter device of claim 5, wherein said coils can be customized.

7. The coupling filter device of claim 6, wherein a number of said coils is two.

8. The coupling filter device of claim 6, wherein a winding number of each of said coils is one.

9. The coupling filter device of claim 8, wherein said insert ends are pre-processed by varnish removal and anti-oxidation.

10. The coupling filter device of claim 6, wherein a winding number of each of said coils is two.

11. The coupling filter device of claim 6, wherein a winding number of each of said coils is greater than two.

12. The coupling filter device of claim 1, wherein said fastening mechanism is an adhesive injection fastening structure.

13. The coupling filter device of claim 12, wherein said adhesive injection fastening structure is a mold having a coil positioning design such that said hollow coils can be inserted and fixed therein and said fixing adhesive (E) is injected therein and then cured.

14. The coupling filter device of claim 12, wherein said house further comprises a chamfer locating outside of said house to auxiliary identity the device's orientation.

15. The coupling filter device of claim 1, wherein said contact portion is a surface mount design (SMD).

16. The coupling filter device of claim 1, wherein said contact portion is a through-hole design.

17. The coupling filter device of claim 1, wherein said device conforms with a circuit board automatic process.

18. The coupling filter device of claim 17, wherein the device is disposed on said circuit board by automatic process actions including grabbing, sucking, positioning and installing.

19. The coupling filter device of claim 1, wherein the device is operable in a high frequency range.

20. The coupling filter device of claim 19, wherein the high frequency range comprises Very High Frequency (VHF), Ultra High Frequency (UHF) and Intermediate Frequency (IF).

* * * * *